United States Patent

Queen

[15] 3,657,734

[45] Apr. 18, 1972

[54] AUDIO POWER AMPLIFIER

[72] Inventor: Daniel L. Queen, Chicago, Ill.

[73] Assignee: Chamberlain Manufacturing Corporation, Waterloo, Iowa

[22] Filed: Oct. 31, 1969

[21] Appl. No.: 873,005

[52] U.S. Cl. ....... 330/15, 330/21

[51] Int. Cl. ....... H03f 3/26

[58] Field of Search ....... 330/15, 121, 123

[56] References Cited

UNITED STATES PATENTS

| | | | |
|---|---|---|---|
| 2,761,917 | 9/1956 | Aronson | 330/15 |
| 2,883,479 | 4/1959 | Aronson | 330/15 |
| 2,918,630 | 12/1959 | Kiebert, Jr. | 330/123 X |

*Primary Examiner*—Nathan Kaufman
*Attorney*—Hill, Sherman, Meroni, Gross & Simpson

[57] ABSTRACT

A transistor amplifier having a push-pull transistor driver stage and a push-pull transistor output stage operatively coupled thereto in which the transistors of the driver stage are biased for class B operation and the transistors of the output stage are biased to approximately collector current cutoff when in a quiescent condition generally corresponding to class B operation, the collector current of the driver stage, in the presence of a signal, being utilized to derive a bias voltage applied to the transistors of the output stage as a forward bias, whereby collector current in such stage flows substantially continuously during a complete electrical cycle of such signal, corresponding to class A operation.

3 Claims, 1 Drawing Figure

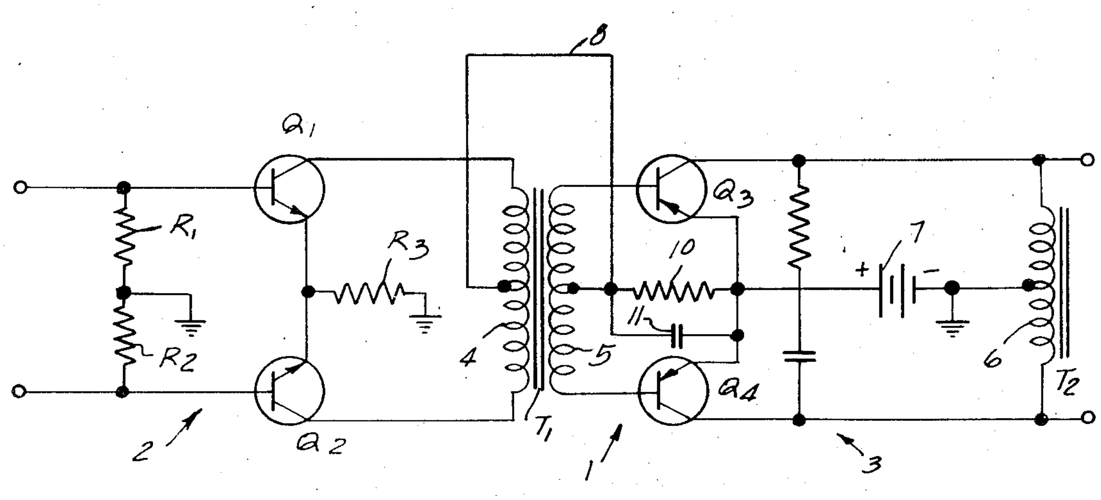
INVENTOR.
DANIEL L. QUEEN
BY Hill, Sherman, Meroni, Gross & Simpson ATTORNEYS

AUDIO POWER AMPLIFIER

BACKGROUND OF THE INVENTION

It has been common practice in the design of transistor amplifiers, particularly where they are battery powered, to employ push-pull class B amplifications, particularly in the output stage, to effect a saving in battery current as the class B circuit draws very little collector current when in a quiescent condition. Thus, while a class A amplifier will have better overall characteristics with respect to distortion, and power gain, the disadvantage of a continuous collector current flow has in most cases dictated the use of a class B amplifier.

The present invention therefore has as a principal object the production of a transistor amplifier which achieves the low current consumption of a class B amplifier, when in a quiescent condition, with the advantages of a class A amplifier in the presence of an input signal.

BRIEF SUMMARY OF THE INVENTION

The invention is directed to an amplifier circuit utilizing a push-pull transistor driver stage and a push-pull transistor output stage in which the driver stage is designed for class B operation, being biased to approximately collector cut off when in a quiescent condition (collector current being normally limited to a very small amount effective to reduce crossover distortion), while the output stage is so designed that when in a quiescent condition, such stage is biased to collector current cut off, generally corresponding to a class B operation. However, disposed in the base circuit of the output stage is a resistance which is also common to the collector circuit of the driver stage whereby the voltage across such resistance will be dependent upon the collector current of the driver stage and thus responsive to the presence of a signal and the increase thereof in the driver stage. The driver collector circuits and output base circuits are so arranged that the voltage drop across such resistance is integrated and applied to the transistor bases of the output stage as a forward bias, operative to produce a class A operation of the output stage, whereby collector current in the output stage flows substantially continuously during a complete electrical cycle of the input signal. The present invention thus combines the low current consumption of a class B amplifier when in a quiescent condition with the advantages of class A amplifier in the presence of an input signal. This is accomplished in the present invention by an extremely simple circuit with a minimum of change in the components required.

BRIEF DESCRIPTION OF THE DRAWINGS

Other objects, features and advantages of the invention will be readily apparent from the following description of a preferred embodiment thereof, taken in conjunction with the accompanying sheet of drawings, although variations and modifications may be effected without departing from the spirit and scope of the novel concepts of the disclosure, and in which:

The FIGURE is a schematic diagram of driver and output stages of an amplifier embodying the present invention.

DETAILED DESCRIPTION OF THE INVENTION

Referring to the drawing, the reference numeral 1 indicates generally an amplifier having a push-pull driver stage, indicated generally by the numeral 2, and a push-pull output stage, indicated generally by the numeral 3, in which the output of the driver stage is coupled to the input of the output stage by a coupling transformer T1 with the output signal of the stage 3 appearing at an output transformer T2.

The driver stage 2 comprises a pair of transistors Q1 and Q2, illustrated as being n-p-n transistors, having their bases connected to a balanced input circuit comprising resistors R1 and R2 having their junction point grounded while the emitters of such transistors are connected to ground through the emitter resistor R3. The collectors of the transistors Q1 and Q2 are connected to respective ends of the center-tapped primary winding 4 of the transformer T1.

Transistors Q3 and Q4 of the output stage, illustrated as comprising PNP transistors, have their bases connected to respective ends of the center-tapped secondary winding 5 of the transformer T1 while the collectors of such transistors are connected to respective ends of a center-tapped winding 6 of the output transformer T2. As illustrated, the emitters of the transistors Q3 and Q4 are connected to the positive side of a battery 7 or other suitable power source, the negative side of which is connected to the center tap of the winding 6.

The center tap of the primary winding 4 of the transformer T1 is connected to the center tap of the secondary winding 5 thereof by a conductor 8. The center tap of the winding 5 is connected to the positive side of the battery 7 by a resistance 10 which thus is common both to the base circuits of the transistors Q3 and Q4 and to the collector circuits of the transistors Q1 and Q2, with the collector current of the driver stage thus flowing through the resistance 10. Variations in collector current flowing in the driver stage thus results in the application of a sliding bias to the transistors of the output stage.

It will be apparent that the driver stage 2 is designed as a class B amplifier and thus, in the absence of a signal, transistors Q1 and Q2 are at substantially cut off whereby at most only a very small current flows in the collector circuit and thus across the resistance 10. At the same time, the transistors Q3 and Q4 of the output stage will have a minimum forward bias whereby they likewise are substantially at cut off in the absence of an input signal. Thus both stages have the advantage of very low no-signal current consumption, associated with class B amplifiers.

When an AC signal appears at the input of the driver stage 2, the base-emitter junction of transistors Q1 and Q2 will alternatively conduct in class B operation as a result of which a full wave rectified current will traverse the resistance 10 with a consequent voltage drop thereacross, the polarity of which is such that an increasing forward bias voltage is applied to the bases of transistors Q3 and Q4 of the output stage. The voltage is filtered by capacitor 11. The respective components are so dimensioned that the forward bias so derived is sufficient to bring the transistors Q3 and Q4 into a class A operation wherein collector current in the output stage will flow substantially continuously during a complete electrical cycle of the input signal.

As the resulting sliding bias is responsive to variations in the input signal a higher average bias will result at higher signal levels to insure efficient class A operation at both low and high signal levels.

It will also be appreciated that as the drive requirements for a class A amplifier are less than those of a class B amplifier, the same driver stage will provide greater driving cababilities with a class A driven stage than it would with a class B driven stage.

It will be appreciated from the above disclosure that I have provided a very simple yet highly efficient amplifier circuit which combines the advantages of class A operation in the output stage with the low quiescent current and efficiency of a class B amplifier.

Various modifications may be made in the circuit in dependence upon specific applications, and obviously the transistor types illustrated for the driver and output stages may be reversed with corresponding reversal of battery polarity. Likewise, where class B amplifier stages are employed ahead of the driver stage 2, additional control voltage may be derived by supplying the collector circuits of such additional stage or stages in connection with the driver stage 2 to increase the differential between current through the resistance 10 in the presence of an input signal, and in the absence of such a signal.

I claim as my invention:

1. In a transistor amplifier, the combination of a push-pull transistor driver stage, and a push-pull transistor output stage, each having an input circuit and an output circuit, the transistors of said driver stage being biased for class B operation, and the transistors of said output stage being biased to approximately collector current cutoff when in a quiescent condition, generally corresponding to class B operation, coupling means operatively connecting the output circuit of said driver stage, and the input circuit of said output stage, a resistance operatively disposed in the input circuit of the output stage between the emitters and bases of the transistors thereof, with one end of said resistance operatively connected to the bases of said output transistors said emitter being connnected to a reference voltage, and means operatively connecting the output circuit of the driver stage to such one end of said resistance, whereby said resistance, in response to an alternating signal, is traversed by the output current of said driver stage, said resistance having a value such that the voltage drop resulting from said driver output current will have a magnitude sufficient as a forward bias, to produce a flow of collector current in such output stage substantially continuously during a complete electrical cycle of said alternating input signal, whereby said output stage has class A operation in the presence of such an input signal.

2. A transistor amplifier according to claim 4, wherein said resistance is shunted by a capacitor.

3. In a transistor amplifier, the combination of a push-pull transistor driver stage, and a push-pull transistor output stage, each having an input circuit and an output circuit, the transistors of said driver stage being biased for class B operation, and the transistors of said output stage being biased to approximately collector current cutoff when in a quiescent condition, generally corresponding to class B operation, coupling means comprising a transformer operatively connecting the output circuit of said driver stage, and the input circuit of said output stage, said transformer having a center-tapped primary winding disposed in the output circuit of said driver stage, and a center-tapped secondary winding disposed in the input circuit of said output stage, a resistance operatively disposed in the input circuit of the output stage between the emitters and bases of the transistors thereof, said emitters being connected to a reference voltage one end of said resistance being connected to the center tap of said secondary winding and the center tap of said primary winding being operatively connected to the juncture of said resistance with said secondary center tap, whereby said resistance, in response to an alternating signal, is traversed by the output current of said driver stage, said resistance having a value such that the voltage drop resulting from said driver output current will have a magnitude sufficient as a forward bias, to produce a flow of collector current in such output stage substantially continuously during a complete electrical cycle of said alternating input signal, whereby said output stage has class A operation in the presence of such an input signal.

* * * * *